US008704305B2

(12) United States Patent
Koo et al.

(10) Patent No.: US 8,704,305 B2
(45) Date of Patent: Apr. 22, 2014

(54) THIN FILM TRANSISTOR

(75) Inventors: Jae-Bon Koo, Yongin-si (KR);
Byoung-Deog Choi, Seoul (KR);
Myeong-Seob So, Cheonan-si (KR);
Won-Sik Kim, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 1367 days.

(21) Appl. No.: 10/959,976

(22) Filed: Oct. 8, 2004

(65) Prior Publication Data

US 2005/0082530 A1    Apr. 21, 2005

(30) Foreign Application Priority Data

Oct. 16, 2003  (KR) .................. 10-2003-0072337

(51) Int. Cl.
*H01L 27/01* (2006.01)
(52) U.S. Cl.
USPC ............................ 257/347; 257/349; 257/350
(58) Field of Classification Search
USPC .................................................. 257/347–354
See application file for complete search history.

(56) References Cited

U.S. PATENT DOCUMENTS

| | | | |
|---|---|---|---|
| 3,577,019 A | 5/1971 | Storm | |
| 4,035,198 A * | 7/1977 | Dennard et al. | 438/297 |
| 4,749,588 A * | 6/1988 | Fukuda et al. | 427/578 |
| 4,809,056 A * | 2/1989 | Shirato et al. | 257/347 |
| 6,020,222 A * | 2/2000 | Wollesen | 438/149 |
| 6,104,040 A | 8/2000 | Kawachi et al. | |
| 6,498,370 B1 | 12/2002 | Kim et al. | |
| 6,628,159 B2 * | 9/2003 | Voldman | 327/534 |
| 7,274,036 B2 | 9/2007 | Choi et al. | |
| 2002/0027246 A1 | 3/2002 | Kunikiyo | |
| 2002/0109187 A1 | 8/2002 | Matsumoto et al. | |
| 2002/0127784 A1 | 9/2002 | Kawanaka et al. | |
| 2004/0124869 A1 | 7/2004 | Lee et al. | |
| 2005/0077844 A1 * | 4/2005 | Koo et al. | 315/366 |

FOREIGN PATENT DOCUMENTS

| | | |
|---|---|---|
| EP | 0816903 | 1/1998 |
| EP | 1517373 | 3/2005 |
| JP | 06-085262 | 3/1994 |
| JP | 6-151859 | 5/1994 |
| JP | 10-173197 | 6/1998 |
| JP | 10-177163 | 6/1998 |
| JP | 10-229199 | 8/1998 |
| JP | 2001-007333 | 1/2001 |
| KR | 10-2004-0092916 | 11/2004 |

OTHER PUBLICATIONS

Assaderaghi, et al., "A Dynamic Threshold Voltage MOSFET (DTMOS) for Ultra-Low Voltage Operation", Technical Digest, IEEE, pp. 809-812 (Dec. 11, 1994).

(Continued)

*Primary Examiner* — Ori Nadav
(74) *Attorney, Agent, or Firm* — H.C. Park & Associates, PLC

(57) ABSTRACT

A thin film transistor of the present invention comprises, an active layer formed on an insulating substrate and having a channel region and source/drain regions; a gate electrode formed corresponding to the channel region of the active region; a body contact region separately formed with the source/drain regions in the active layer; source/drain electrodes each connected to the source/drain regions; and a conductive wiring for connecting the body contact region and the gate electrode.

15 Claims, 9 Drawing Sheets

(56) References Cited

OTHER PUBLICATIONS

Office Action dated Nov. 16, 2005 (for U.S. Appl. No. 10/910,350).
Office Action dated Apr. 5, 2006 (for U.S. Appl. No. 10/910,350).
Office Action dated Oct. 19, 2006 (for U.S. Appl. No. 10/910,350).
Notice of Allowance dated Apr. 19, 2007 (for U.S. Appl. No. 10/910,350).

"Dynamic Thresold-Voltage Mosfet (DTMOS) for Ultra-Low Voltage VLSI," IEEE Transactions on Electron Devices, IEEE Service Center, vol. 44, No. 3, Mar. 1997, pp. 414-422; Fariborz Assaderaghi, et al.
"DTMOS: Its Derivatives and Variations, and Their Potential Applications," Extended Abstracts of the International Conference on Solid State Devices and Materials, Japan Society of Applied Physics Tokyo, JP, Sep. 1998, pp. 310-311, XP000823195.

\* cited by examiner

THIN FILM TRANSISTOR

CROSS-REFERENCE TO RELATED APPLICATION

This application claims the benefit of Korean Patent Application No. 2003-72337, filed Oct. 16, 2003, the disclosure of which is hereby incorporated herein by reference in its entirety.

BACKGROUND OF THE INVENTION

1. Field of the Invention

The present invention relates to a thin film transistor that may be used in a display device and more particularly to a gate-body contact thin film transistor having a gate electrode connected with an impurity region for a body contact formed in an active layer.

2. Description of the Related Art

A polysilicon thin film transistor used in a flat panel display may be a floating body TFT in which an island-type active layer may be floated. The floating body TFT may have the problem that both the drain current and the saturation region of the drain current may be reduced as the device is miniaturized.

A thin film transistor with a gate-body contact structure to try to solve this issue was discussed in Korean Patent Application No. 2003-056594. The device described in that document may have the advantages that a low voltage drive may be possible and a threshold voltage with a steep slope and a high drain current can be provided by forming a body contact region that may have a conductivity-type opposite to source/drain regions in the active layer and applying the gate voltage.

Such a thin film transistor, however, may require extra wiring for connecting the body contact region and the gate electrode. An extra wiring process may be made before forming the active layer to directly contact a metal connection wiring with an amorphous silicon layer, but this method may have the problem that the active layer may be contaminated by the metal material of the connection wiring.

SUMMARY OF THE INVENTION

It is therefore an aspect of the present invention to provide a gate-body contact thin film transistor and method of manufacturing the same that can simplify the process and prevent contamination of an active layer due to metal material.

According to one aspect of the present invention, there may be provided a thin film transistor comprising: an active layer formed on an insulating substrate and having a channel region and source/drain regions; a gate electrode arranged in the channel region of the active layer; a body contact region separately formed with the source/drain regions on the active layer; source/drain electrodes each connected to the source/drain regions; and a conductive wiring for connecting the body contact region and the gate electrode.

The conductive wiring may be made of the same material as the gate electrode and may be formed in a body with the gate electrode or in a separate island bridge type pattern, and the conductive wiring may be made of a different conductive material from the gate electrode, and may have a bridge type pattern structure separated from the gate electrode. The conductive wiring comprises a contact wiring having an island-type bridge pattern structure, made of the same material as the gate electrode and connected to the body contact region; and a connection wiring made of a different material from the contact wiring and for connecting the contact wiring and the gate electrode.

The conductive wiring may be made of the same material as the source/drain electrodes, or a different material from the source/drain electrodes and may have an island-type bridge pattern structure. The conductive wiring may have a bridge pattern structure and comprises: first and second contact wiring made of the same material as the source/drain electrodes and connected to the gate electrode and the body contact region, respectively; and a connection wiring made of a different material from the first and second contact wirings and for connecting the first and second contact wirings.

The conductive wiring may be made a transparent conductive layer and may have an island-type bridge pattern structure. The conductive wiring comprises: first and second contact wirings made of a transparent conductive material and connected to the gate electrode and the body contact region, respectively; and a connection wiring made of a different material from the first and second contact wirings and for connecting the first and second contact wirings.

The source/drain regions and the body contact region are impurity regions having a conductivity type opposite to each other, and the channel region may be an intrinsic region.

Further, there may be provided a thin film transistor for a flat panel display comprising at least a pixel electrode, the thin film transistor comprising: an active layer formed on an insulating substrate, and having a channel region and source/drain regions; a gate electrode formed corresponding to the channel region of the active layer; a body contact region separately formed with the source/drain regions in the active layer; source/drain electrodes each connected to the source/drain regions; and a conductive wiring for connecting the body contact region and the gate electrode, wherein the wiring may be formed in a body with the gate electrode or in a separate island-type bridge pattern, and may be made of the same material as at least one electrode of the gate electrode, the source/drain electrodes or the pixel electrode.

Further, there may be provided a thin film transistor comprising: an active layer formed on an insulating substrate and having a channel region and source/drain regions; a first insulating layer formed on the substrate to cover the active layer; a gate electrode formed corresponding to the channel region of the active region; a second insulating layer formed to cover the gate electrode; a body contact region separately formed with the source/drain regions in the active layer; source/drain electrodes each connected to the source/drain regions; a contact hole formed on the first insulating layer to expose a portion of the body contact region; and a conductive wiring for connecting the body contact region and the gate electrode through the contact hole.

The conductive wiring may be formed roughly coplanar with the gate electrode, and the gate electrode and the body contact region are electrically connected by the conductive wiring through the contact hole. The conductive wiring may be formed to extend from the gate electrode, and the gate electrode and the body contact region are electrically connected by the conductive wiring through the contact hole.

Further, there may be provided a thin film transistor comprising: an active layer formed on an insulating substrate and having a channel region and source/drain regions; a first insulating layer formed on the substrate to cover the active layer; a gate electrode formed corresponding to the channel region of the active layer; a second insulating layer formed to cover the gate electrode; a body contact region separately formed with the source/drain regions in the active layer; source/drain electrodes each connected to the source/drain regions; a first contact hole formed on at least the second insulating layer of the first and second insulating layers to expose a portion of the gate electrode; a second contact hole formed on at least the first insulating layer of the first and second insulating layers to expose a portion of the body contact region; and a conductive wiring for connecting the body contact region and the gate electrode through at least the second contact hole of the first contact hole and the second contact hole.

When the wiring may be formed roughly coplanar with the gate electrode, the gate electrode and the body contact region may be electrically connected by the wiring through only the second contact hole formed on the first insulating layer; and when the wiring may be formed roughly coplanar with the source/drain electrodes, the gate electrode and the body contact region may be electrically connected by the wiring through the first contact hole formed on the second insulating layer and the second contact hole formed across the first and second insulating layers.

Further, there may be provided a thin film transistor for a flat panel display comprising at least a pixel electrode, the thin film transistor comprising: an active layer formed on an insulating substrate and having a channel region and source/drain regions; a first insulating layer formed on the substrate to cover the active layer; a gate electrode formed corresponding to the channel region of the active region; a second insulating layer formed to cover the gate electrode; a body contact region separately formed with the source/drain regions in the active layer; source/drain electrodes each connected to the source/drain regions; a third insulating layer formed below the pixel electrode; a first contact hole formed at least on the second insulating layer of the first to third insulating layers to expose a portion of the gate electrode; a second contact hole formed at least on the first insulating layer of the first to third insulating layers to expose a portion of the body contact region; and a conductive wiring for connecting the body contact region and the gate electrode through at least the second contact hole of the first contact hole and the second contact hole.

When the wiring is formed roughly coplanar with the gate electrode, the gate electrode and the body contact region are electrically connected by the wiring through only the second contact hole formed on the first insulating layer; and when the wiring is formed roughly coplanar with the source/drain electrodes, the gate electrode and the body contact region are electrically connected by the wiring through the first contact hole formed in the second insulating layer and the second contact hole formed across the first and second insulating layers; and when the wiring is formed roughly coplanar with the pixel electrode, the gate electrode and the body contact region are electrically connected by the wiring through the first contact hole formed across the second and third insulating layers and the second contact hole formed across the first to third insulating layers.

The present invention may be more fully understood from the following detailed description of exemplary embodiments thereof taken in conjunction with the accompanying drawings.

BRIEF DESCRIPTION OF THE DRAWINGS

The above and other features and advantages of the present invention will become more apparent to those of ordinary skill in the art in view of the following detailed description of several embodiments thereof with reference to the attached drawings.

DETAILED DESCRIPTION OF THE INVENTION

The present invention will now be described more fully with reference to the accompanying drawings, in which several embodiments of the invention are shown. This invention may, however, be embodied in different forms and should not be construed as limited to the embodiments set forth herein. Rather, these embodiments are provided as examples. The drawings are not to scale, particularly with regard to the thickness of layers. Like numbers refer to like elements throughout the specification. As used herein, the word "same" refers to substantial similarity, not exact identity.

Figure 1:
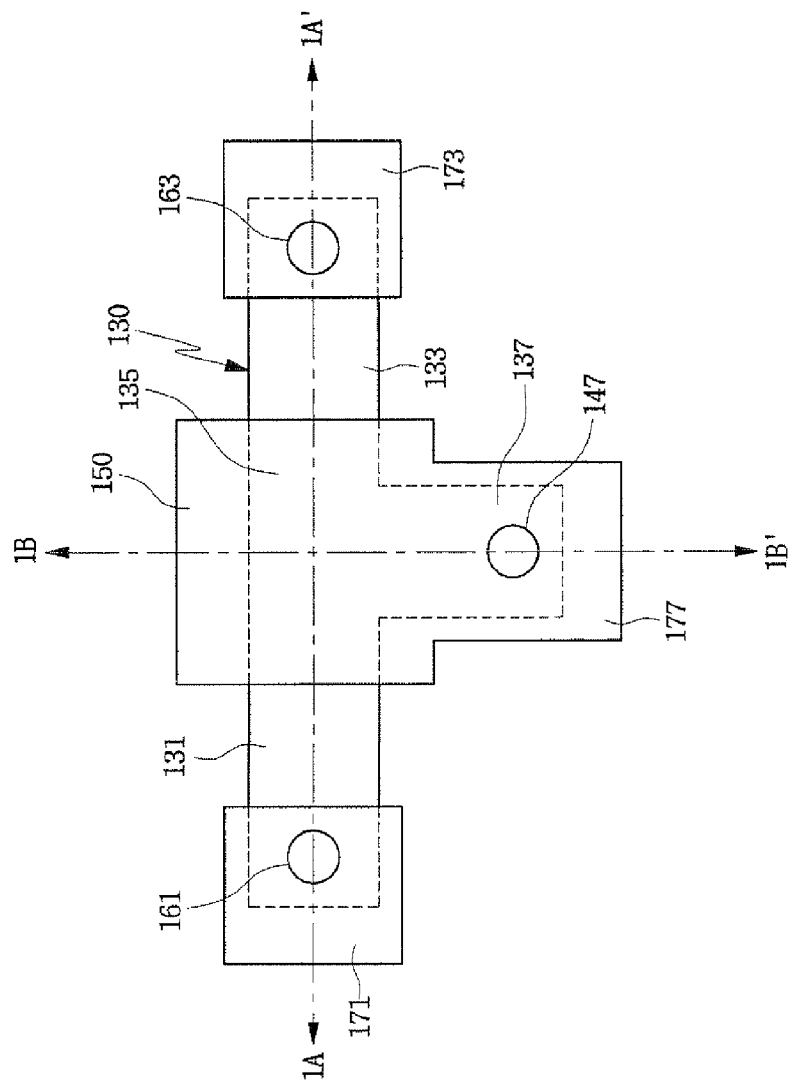
FIG. 1 is a plan view of a gate-body contact thin film transistor according to a first embodiment of the present invention.

FIG. 1 is a plan view of a gate-body contact thin film transistor according to a first embodiment of the present invention.

Referring to FIG. 1, a thin film transistor according to an embodiment of the present invention may include an active layer 130, a gate electrode 150 and source/drain electrodes 171, 173. The active layer 130 may have source/drain regions 131, 133 with a channel region 135 therebetween, and a body contact region 137 separately formed with the source/drain regions 131, 133.

The gate electrode 150 may be formed corresponding to the channel region 135 of the active layer 130. The source electrode 171 may be formed corresponding to the source region 131 and may be electrically connected with the impurity region 131 through a contact 161. The drain electrode 173 may be formed corresponding to the drain region 133, and may be electrically connected with the impurity region 133 for the drain through a contact 163.

Meanwhile, a contact wiring 177 corresponding to the body contact region 137 may extend from the gate electrode 150, and the contact wiring 177 may be a bridge pattern that connects the body contact region 137 and the gate electrode 150 through a contact 147 formed in the body contact region 137. The contact wiring 177 can be formed in a body with the gate electrode 150 as shown in FIG. 1, or in an island form separated from the gate electrode 150.

Figure 2A:
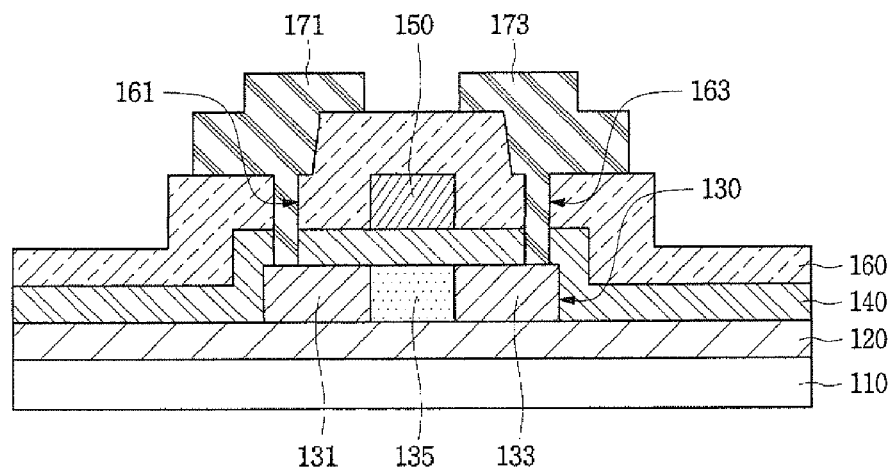
FIG. 2a is a cross-sectional view of the gate-body contact thin film transistor taken along line 1A-1A' of FIG. 1.
Figure 2B:
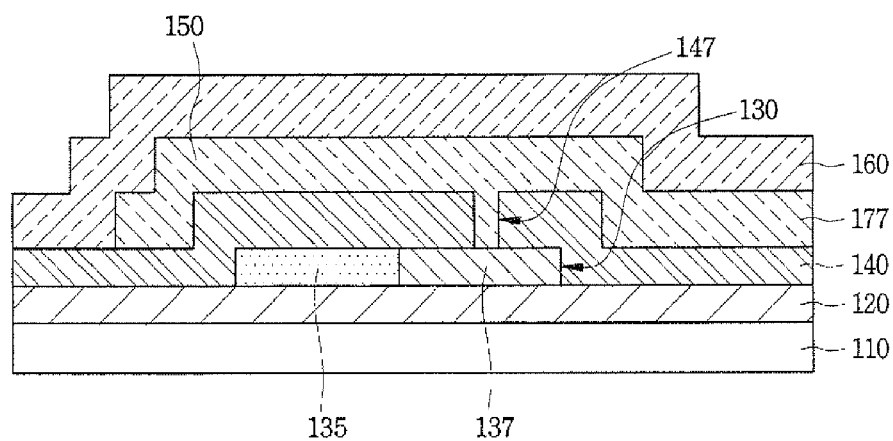
FIG. 2b is a cross-sectional view of the gate-body contact thin film transistor taken along line 1B-1B' of FIG. 1.

FIGS. 2a and 2b are cross-sectional views of a gate-body contact thin film transistor according to a first embodiment, each of which illustrates a cross-sectional structure taken along lines 1A-1A' and 1B-1B' of FIG. 1. A method of manufacturing a thin film transistor according to the first embodiment of the present invention will now be described with reference to FIGS. 2a and 2b.

First, a buffer layer 120 may be formed on an insulating substrate 110. An amorphous silicon layer may be deposited on the buffer layer 120 and may be crystallized to a polysilicon layer using any crystallization method, and an active layer 130 may be formed in an island form by patterning the polysilicon layer.

Next a body contact region 137 may be formed. In one embodiment, a first photoresist layer (not shown) may be formed to expose only a portion of the active layer 130 where the body contact region 137 may be intended to be formed. A body contact region 137 may then, in such a case, be formed by ion-implanting high concentration impurities of a first conductivity type into the active layer 130 exposed using the first photoresist layer as a mask. The body contact region 137 may be formed in contact with a channel region 135 on one side and may be separated from source/drain regions 131, 133 by the channel region 135.

A gate insulating layer 140 may be formed on substantially the entire surface of the substrate, and a portion of the gate insulating layer 140 corresponding to the body contact region 137 may be etched to form a body contact 147. Next, a conductive material such as metal may be deposited on the gate insulating layer 140, and then may be patterned to form a gate electrode 150. A contact wiring 177 may be formed extending from the gate electrode 150. The contact wiring 177 may have a bridge pattern for electrically connecting the body contact region 137 and the gate 150 through the body contact 147.

Next, a second photoresist layer (not shown) may be formed on a portion of the gate insulating layer 140 corresponding to the body contact region 137, and using the gate electrode 150 and the second photoresist layer as a mask, high concentration impurities of a second conductivity type having a conductivity type opposite to that of body contact region 137 may be ion-implanted onto the active layer 130 to form the source/drain regions 131, 133.

An interlayer insulating layer 160 may be deposited on the entire surface of the substrate, and then the interlayer insulating layer 160 and the gate insulating layer 140 are etched to form source/drain contacts 161, 163 exposing the source/drain regions 131, 133. Next, the conductive material such as metal may be deposited on the entire surface of the substrate and patterned to form the source/drain electrodes 171, 173, each of which may be connected to the source/drain regions 131, 133 through the contacts 161, 163.

As described above, by forming the contact wiring 177 in a body at the same time when forming the gate electrode 150, an additional wiring for forming the gate electrode 150 and the body contact region 137 may be not required.

Figure 2C:
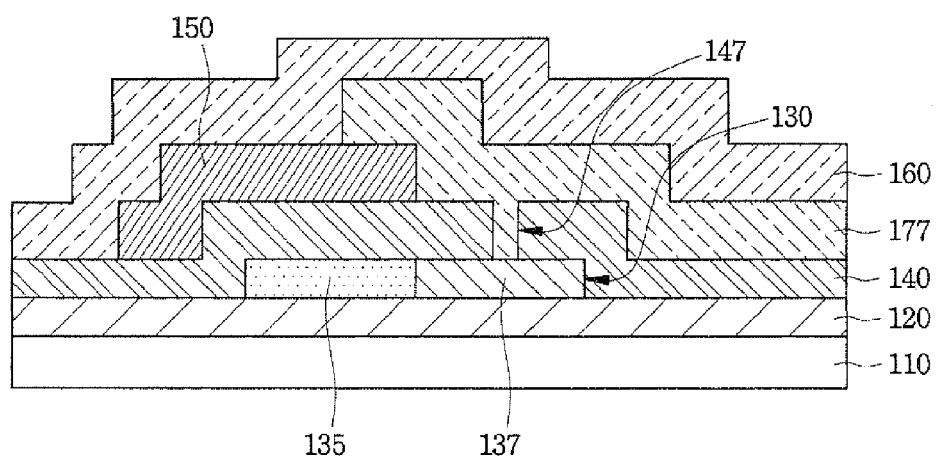
FIG. 2c is a cross-sectional view of the gate-body contact thin film transistor taken along line 1B-1B' of FIG. 1.

Meanwhile, the gate electrode 150 and the body contact region 137 can be connected through the additional contact wiring as shown in FIG. 2c. FIG. 2c is another cross-sectional view taken along line 1B-1B' of FIG. 1.

Referring to FIG. 2c, as illustrated above, the gate insulating layer 140 may be etched to form the body contact 147, and then the gate 150 may be formed on the gate insulating layer 140 corresponding to the channel region 135. Next, the conductive layer may be deposited on the entire surface of the substrate and patterned to form the contact wiring 177 that electrically and may directly contact the gate electrode 150 and also may contact the body contact region 137 through the body contact 147 at the same time.

As another example, when forming the gate electrode 150, the gate electrode 150 and the body contact region 137 can be connected through the contact wiring 177 by forming the contact wiring 177 connected to the contact 147 and then by forming a connection wiring made of a different material from the gate electrode 150.

Figure 3:
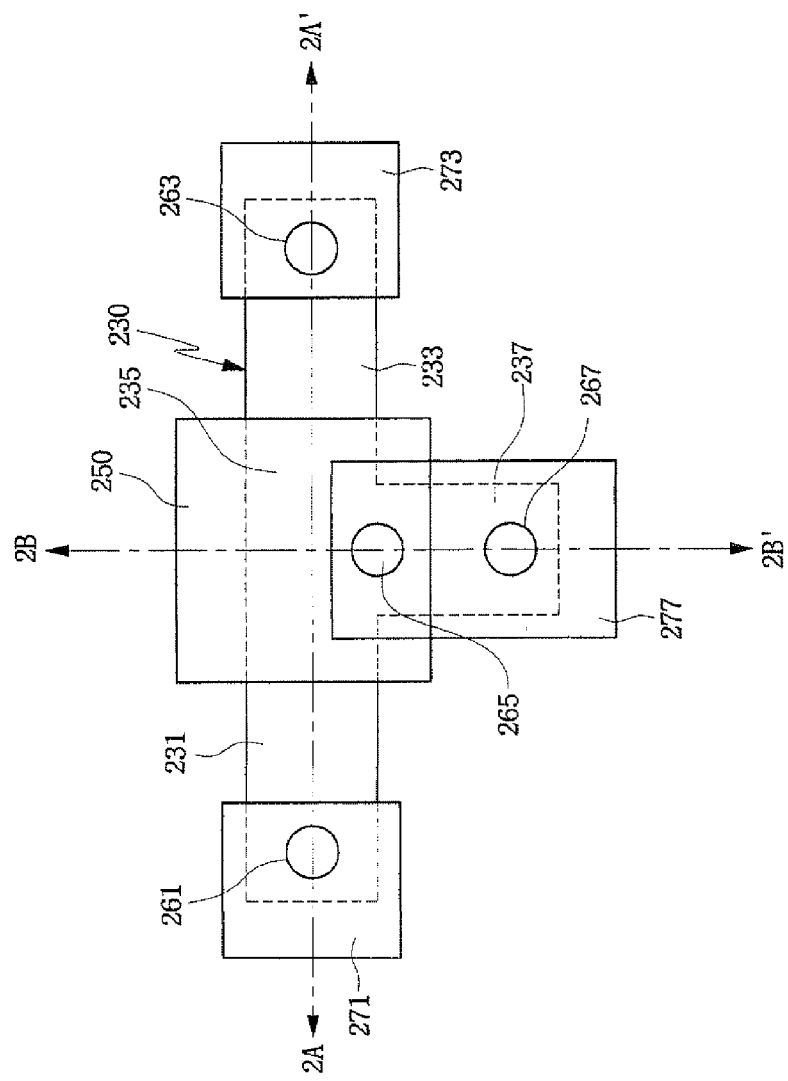
FIG. 3 is a plan view of a gate-body contact thin film transistor according to a second embodiment of the present invention.

FIG. 3 is a plan view of a gate-body contact thin film transistor according to a second embodiment of the present invention.

Referring to FIG. 3, a thin film transistor according to the second embodiment of the present invention may include an active layer 230, a gate electrode 250 and source/drain electrodes 271, 273. The active layer 230 may include source/drain regions 231, 233 with a channel region 235 therebetween and a body contact region 237 separately formed with the source/drain regions 231, 233.

The gate electrode 250 may be formed corresponding to the channel region 235 of the active layer 230. The source electrode 271 may be formed corresponding to the source region 231, and may be electrically connected to the impurity region 231 through a contact 261. The drain electrode 273 may be formed corresponding to the drain region 233 and may be electrically connected to the impurity region 233 for the drain through a contact 263.

Meanwhile, a contact wiring 277 may be formed corresponding to the body contact region 237. The contact wiring 277 may have an island-type bridge pattern for connecting the body contact region 237 and the gate electrode 250. This may be accomplished by connecting through the contact 265 formed on the gate electrode 250 and the contact 267 formed on the body contact region 237.

Figure 4A:
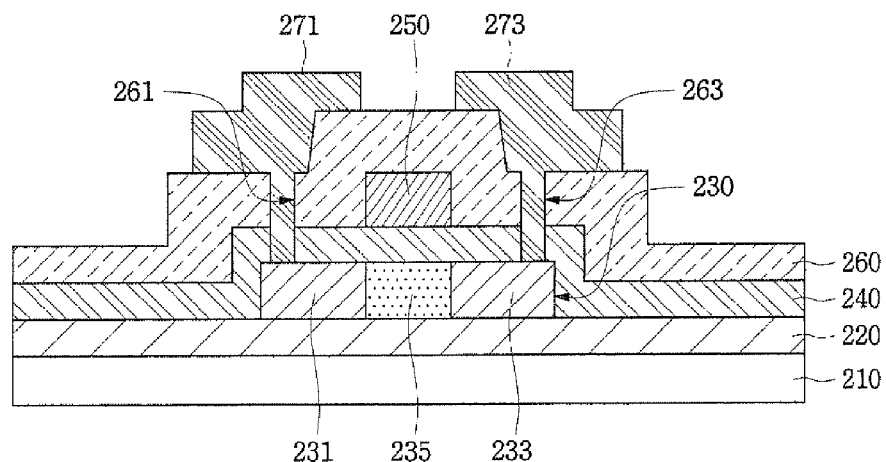
FIG. 4a is a cross-sectional view of the gate-body contact thin film transistor taken along line 2A-2A' of FIG. 3.
Figure 4B:
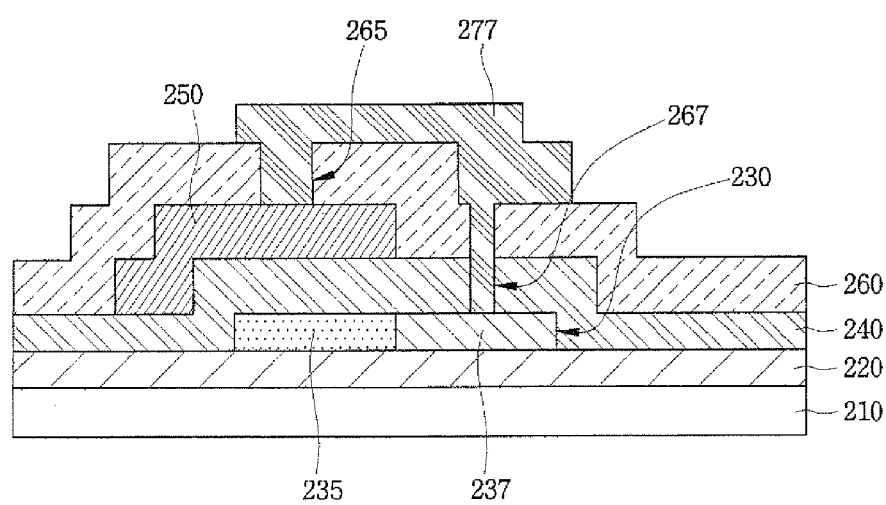
FIG. 4b is a cross-sectional view of the gate-body contact thin film transistor taken along line 2B-2B' of FIG. 3.

FIGS. 4a and 4b are cross-sectional views of the gate-body contact thin film transistor according to the second embodiment, each of which illustrates a cross-sectional structure taken along lines 2A-2A' and 2B-2B' of FIG. 3. A method of manufacturing a thin film transistor of the present invention will now be described with reference to FIGS. 4a and 4b.

First, a buffer layer 220 on an insulating substrate 210 may be formed, and an amorphous silicon layer may be deposited on the buffer layer 220 and may be crystallized to a polysilicon layer using any crystallization method, and the polysilicon layer may be patterned to form an island-type active layer 230.

Next a body contact region 237 may be formed. In one embodiment a first photoresist layer (not shown) may be formed to expose only a portion of the active layer 230 where a body contact region 237 may be intended to be formed. The body contact region 237 may be formed by ion-implanting high concentration impurities of a first conductivity type into the active layer 230 exposed using the first photoresist layer as a mask. The body contact region 237 may be formed such that it may contact the channel region 235 at one side and may be separated from the source/drain regions 231, 233 by the channel region 235.

Next, a gate insulating layer 240 may be formed on the entire surface of the substrate, and a conductive material such as metal may be deposited on the gate insulating layer 240, and then may be patterned to form a gate electrode 250. A second photoresist layer (not shown) may be formed on a portion of the gate insulating layer 240 corresponding to the body contact region 237, and using the gate electrode 250 and the second photoresist layer as a mask, high concentration impurities of a second conductivity type having a conductivity type opposite to that of the body contact region 237 may be ion-implanted into the active layer 230 to form the source/drain regions 231, 233.

An interlayer insulating layer 260 may be deposited on the entire surface of the substrate, and then the interlayer insulating layer 260 and the gate insulating layer 240 are etched to form source/drain contacts 261, 263 that expose the source/drain regions 231, 233, and the contacts 265, 267 are also formed, each of which exposes the gate electrode 250 and the body contact region 237.

Next, the conductive material such as metal may be deposited and patterned on the entire surface of the substrate to form source/drain electrodes 271, 273 each connected to the source/drain regions 231, 233 through the contacts 261, 263, and also to form an island-type contact wiring 277 formed for connecting the body contact region 237 and the gate electrode 250 through the contacts 265, 267.

According to the second embodiment, contact holes 265, 267 for connecting the gate electrode 250 and the body contact region 237 are simultaneously formed in the process for forming the source/drain contacts 261, 263, and the contact wiring 277 may be simultaneously formed in the process for forming the source/drain electrode 271, 273, thereby forming the contact wiring 277 for forming the gate electrode 250 and the body contact region 237 without any additional process.

Meanwhile, as another example, by forming the source/drain electrodes 271, 273 followed by depositing and patterning the conductive layer, the contact wiring 277 made of a different conductive material from the source/drain electrode 271, 273 and connecting the body contact region 237 and gate 250 through the contacts 265, 267 can be formed.

Figure 4C:
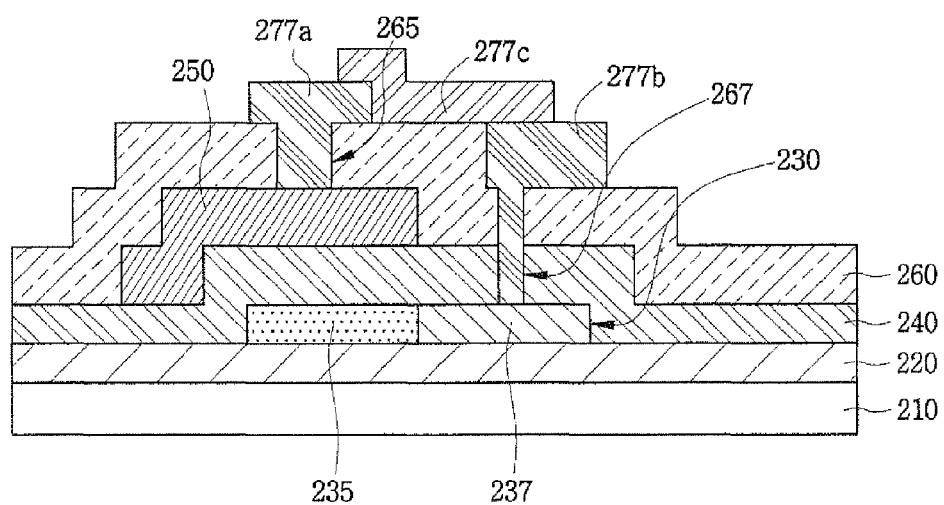
FIG. 4c is a cross-sectional view of the gate-body contact thin film transistor taken along line 2B-2B' of FIG. 3.

As still another example, by respectively forming the contact wirings 277a, 277b connected to each contact 265, 267 when forming the source/drain electrodes 271, 273 and then by depositing and patterning a different conductive material from the source/drain electrode material, the connection wiring 277c for connecting the body contact region 237 and the gate 250 through the contact wirings 277a, 277b can be separately formed, as shown in FIG. 4c showing another cross-sectional view taken along line 2B-2B' of FIG. 3.

Figure 5:
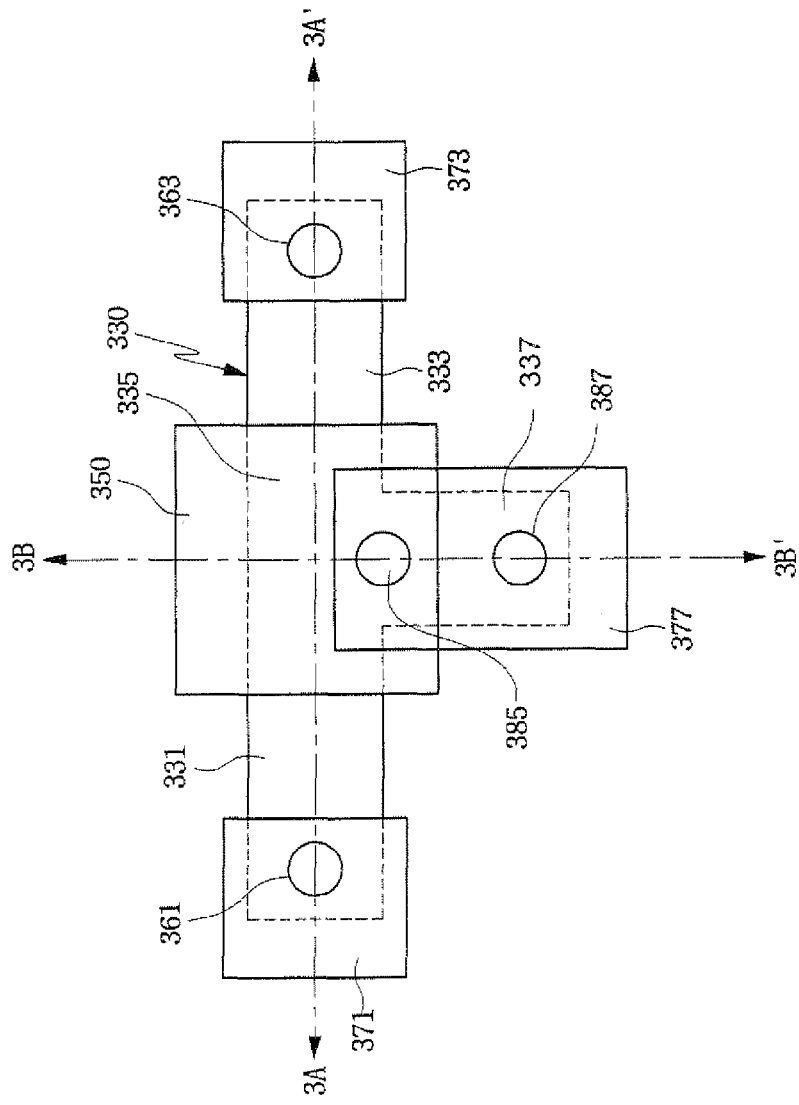
FIG. 5 is a plan view of a gate-body contact thin film transistor according to a third embodiment of the present invention.

FIG. 5 illustrates a plan view of a gate-body contact thin film transistor according to a third embodiment of the present invention.

Referring to FIG. 5, a thin film transistor according to an embodiment of the present invention may include an active layer 330, a gate electrode 350, and source/drain electrodes 371, 373. The active layer 330 may have source/drain regions 331, 333 with a channel region 335 therebetween, and a body contact region 337 separately formed with the source/drain regions 331, 333.

The gate electrode 350 may be formed corresponding to the channel region 335 of the active layer 330. The source electrode 371 may be formed corresponding to the source region 331 and may be electrically connected to the impurity region 331 through a contact 361. The drain electrode 373 may be formed corresponding to the drain region 333 and may be electrically connected to the impurity region 333 for the drain through a contact 363.

Meanwhile, a contact wiring 377 corresponding to the body contact region 337 may be formed, and connects the body contact region 337 and the gate electrode 350 through the contact 385 formed on the gate electrode 350 and the contact 387 formed on the body contact region 337. The contact wiring 377 may be made of the same material as the source/drain electrodes 371, 373, and may have an island-type bridge pattern.

Figure 6A:
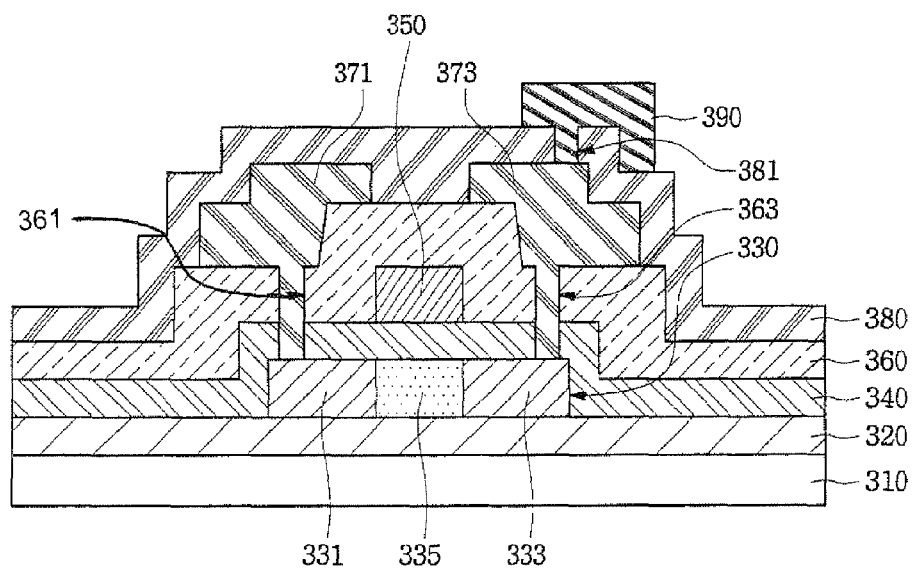
FIG. 6a is a cross-sectional view of the gate-body contact thin film transistor taken along line 3A-3A' of FIG. 5.
Figure 6B:
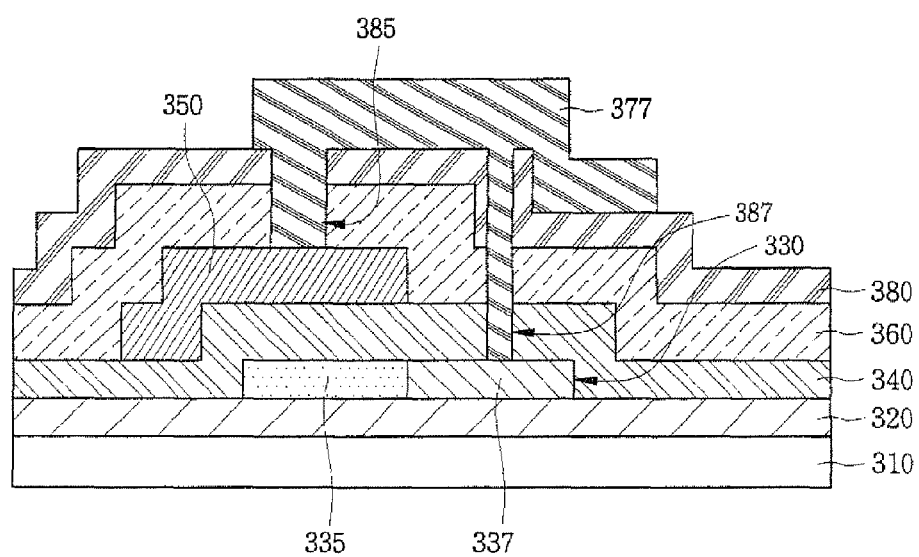
FIG. 6b is a cross-sectional view of the gate-body contact thin film transistor taken along line 3B-3B' of FIG. 5.

FIGS. 6a and 6b show cross-sectional structures taken along lines 3A-3A' and 3B-3B' of FIG. 5. A method of manufacturing a thin film transistor of the present invention will now be described with reference to FIGS. 6a and 6b.

First, a buffer layer 320 may be formed on an insulating substrate 310, and an amorphous silicon layer may be deposited on the buffer layer 320, and may be crystallized to a polysilicon layer using any crystallization method, the active layer 330 may be formed in the island-type by patterning the polysilicon layer.

Next, a first photoresist layer (not shown) may be formed to expose only a portion of the active layer 330 in which the body contact region 337 may be intended to be formed. The body contact region 337 may be formed by ion-implanting high concentration impurities of a first conductivity type into the active layer 330 exposed using the first photoresist layer as a mask. The body contact region 337 may be formed such that it may contact the channel region 335 at one side and may be separately formed with the source/drain regions 331, 333 by the channel region 335.

Next, a gate insulating layer 340 may be formed on the entire surface of the substrate, and a conductive material such as metal may be deposited on the gate insulating layer 340 and patterned to form the gate electrode 350. A second photoresist layer (not shown) on a portion of the gate insulating layer 340 may be formed corresponding to the body contact region 337, and using the gate electrode 350 and the second photoresist layer as a mask, high concentration impurities of a second conductivity type having a conductivity type opposite to the body contact region 337 may be ion-implanted to form source/drain regions 331, 333.

An interlayer insulating layer 360 may be deposited on the entire surface of the substrate, and then the interlayer insulating layer 360 and the gate insulating layer 340 are etched to form source/drain contacts 361, 363 that expose the source/drain regions 331, 333.

Next, a conductive material such as metal may be deposited and patterned on the entire surface of the substrate to form source/drain electrodes 371, 373, each of which may be connected to the source/drain regions 331, 333 through the contacts 361, 363. By forming the source/drain electrodes 371, 373 and by depositing the insulating layer 380 on the entire surface of the substrate, and then etching the interlayer insulating layer 360 and the gate insulating layer 340, a contact 385 exposing a portion of the gate electrode 350 and a contact 387 exposing a portion of the body contact 337 are formed.

Next, a conductive material may be deposited on the entire surface of the substrate and patterned to form a contact wiring 377 that connects the gate electrode 350 and the body contact region 337. When a transparent conductive material such as ITO may be used for the above conductive material, in the case that the gate-body contact thin film transistor having the contact wiring 377 may be applied to a flat panel display such as OLED, the contacts 385, 387 are formed while forming a via hole 381 that exposes the drain electrode 373, for example, of the source/drain electrodes 371, 373, and the contact wiring 377 may be formed while forming a pixel electrode 390 by patterning the transparent conductive material as shown in FIG. 6a, thereby making possible that the contact wiring 377 for forming the gate electrode 350 and the body contact region 337 may be formed without any additional process. Here, a passivation layer or a planarization layer and the like are used as the above insulating layer 380.

Figure 6C:
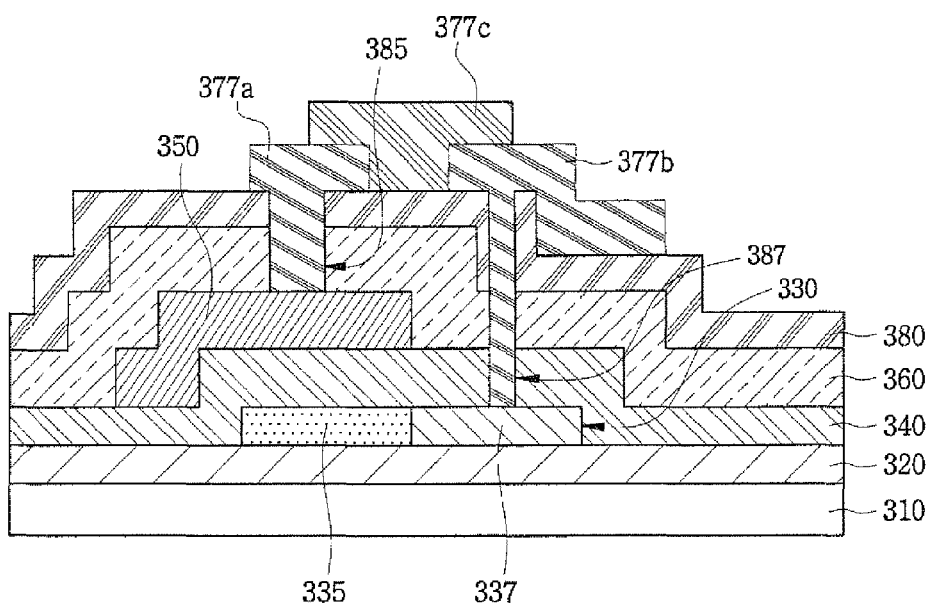
FIG. 6c is a cross-sectional view of the gate-body contact thin film transistor taken along line 3B-3B' of FIG. 5.

Meanwhile, as another example, after respectively forming the contact wirings 377a, 377b each connected to the contacts 385, 387 when forming the pixel electrode 390 with the transparent conductive layer, as shown in FIG. 6c that shows another cross-sectional structure taken along line 3B-3B' of FIG. 5, by depositing and patterning the conductive layer, the connection wiring 377c can be additionally formed for connecting the body contact region 337 and the gate 350 through the contact wirings 377a, 377b.

According to the embodiments of the present invention, the source/drain regions and the body contact region may have a different conductivity type from each other. For example, the body contact region may consist of a heavily doped p-type region while the source/drain regions may consist of a heavily doped n-type region. Contrarily, when the source/drain regions consist of a heavily doped p-type region, the body contact region consists of a heavily doped n-type region. Here, the channel region of the active layer may be an intrinsic region where the impurities of the first or second conductivity type are not doped.

According to the embodiments of the present invention, instead of forming the body contact region followed by forming the source/drain regions, the body contact region can be formed by forming the source/drain regions of the second conductivity type using the gate electrode and the second photoresist layer as a mask, followed by forming the first photoresist layer on the gate insulating layer to expose only a portion of the gate insulating layer corresponding to the body contact region, and by ion-implanting high concentration impurities of a first conductivity type into the active layer using the first photoresist layer as a mask.

Further, while the above embodiments describe that the body contact region may be formed in the thin film transistor where the source/drain regions are made of a heavily doped region, the source/drain regions are also applicable to the thin film transistor having an LDD structure of a heavily doped region and a lightly doped region.

According to the embodiments of the present invention as described above, by forming the connection wiring for connecting the body contact region formed in the active region and the gate during thin film transistor process, it may have a merit that any additional wiring process for connecting may be not required and contamination of metal due to the direct contact of the connection wiring with the polysilicon can be prevented.

Further, by electrically connecting the contact wiring for applying the power supply to the body contact region with the gate electrode, a low voltage drive may be possible, thus reducing the swing range of the threshold voltage and obtaining a high drain current with the low gate voltage.

While several embodiments of the present invention are described above, those skilled in the art will appreciate that a variety of change and modification can be made without departing from the idea and scope of the present invention described in the appended claims.

What is claimed is:

1. A thin film transistor comprising:
an active layer formed on an insulating substrate and having a channel region, a source region, and a drain region;
a gate electrode arranged corresponding to the channel region of the active layer;
a body contact region physically contacting the channel region and being separated from the source region and the drain region in the active layer;
a source electrode connected to the source region and a drain electrode connected to the drain region; and
a conductive wiring for connecting the body contact region and the gate electrode,
wherein the conductive wiring physically contacts the gate electrode,
wherein the body contact region is an impurity region and the channel region is an intrinsic region, and
wherein the conductive wiring and the gate electrode are formed directly on the same layer.

2. The thin film transistor of claim 1, wherein the conductive wiring is formed in a configuration selected from the group consisting of: integrally formed with the gate electrode; and in a separate island-type bridge pattern.

3. The thin film transistor of claim 2, wherein the conductive wiring is made of the same material as a material of the gate electrode.

4. The thin film transistor of claim 2, wherein the conductive wiring is made of a different conductive material from a material of the gate electrode.

5. The thin film transistor of claim 1, wherein the body contact region and the channel region are part of the same layer.

6. The thin film transistor of claim 2, wherein the conductive wiring has an island-type bridge pattern structure, the wiring comprising:
a contact wiring made of the same material as the gate electrode and connected to the body contact region; and
a connection wiring is made of a different material from the contact wiring and for connecting the contact wiring and the gate electrode.

7. The thin film transistor of claim 2, wherein the conductive wiring is made of the same material as the source/drain electrodes, and has an island-type bridge pattern structure.

8. The thin film transistor of claim 2, wherein the conductive wiring is made of a different material from the source/drain electrodes, and has an island-type bridge pattern structure.

9. The thin film transistor of claim 2, wherein the conductive wiring has a bridge pattern structure, the wiring comprising:
first and second contact wirings made of the same material as the source/drain electrodes and connected to the gate electrode and the body contact region; and
a connection wiring made of a different material from the first and second contact wirings and for connecting the first and second contact wirings.

10. The thin film transistor of claim 2, wherein the conductive wiring is a transparent conductive layer and has an island-type bridge pattern structure.

11. The thin film transistor of claim 2, wherein the conductive wiring has a bridge pattern structure, the wiring comprising:
first and second contact wirings made of a transparent conductive material and connected to the gate electrode and the body contact region; and
a connection wiring made of a different material from the first and second contact wirings and for connecting the first and second contact wirings.

12. The thin film transistor of claim 1, wherein the source region and the drain region are impurity regions having a conductivity type opposite to that of the body contact region.

13. A thin film transistor comprising:
an active layer formed on an insulating substrate and having a channel region, a source region, and a drain region;
a first insulating layer formed on the substrate to cover the active layer;
a gate electrode formed corresponding to the channel region of the active layer;
a second insulating layer formed to cover the gate electrode;

a body contact region physically contacting the channel region and being separated from the source region and the drain region in the active layer;
a source electrode connected to the source region and a drain electrode connected to the drain region;
a contact hole formed on the first insulating layer to expose a portion of the body contact region; and
a conductive wiring for connecting the body contact region and the gate electrode through the contact hole,
wherein the conductive wiring physically contacts the gate electrode, and
wherein the conductive wiring and the gate electrode are formed directly on the same layer.

14. The thin film transistor of claim 13, wherein the conductive wiring is formed in the same plane with the gate electrode, and the gate electrode and the body contact region are electrically connected by the conductive wiring through the contact hole.

15. The thin film transistor of claim 13, wherein the conductive wiring extends from the gate electrode, and the gate electrode and the body contact region are electrically connected by the conductive wiring through the contact hole.

* * * * *